United States Patent [19]

Morrison et al.

[11] Patent Number: 4,633,477
[45] Date of Patent: Dec. 30, 1986

[54] SEMICONDUCTOR LASER WITH BLOCKING LAYER

[75] Inventors: Charles B. Morrison; Luis Figueroa; Andre Burghard, all of Torrance, Calif.

[73] Assignee: TRW Inc., Redondo Beach, Calif.

[21] Appl. No.: 632,767

[22] Filed: Jul. 20, 1984

[51] Int. Cl.⁴ .............................................. H01S 3/19
[52] U.S. Cl. ........................................ 372/46; 357/17; 372/48
[58] Field of Search ...................... 372/44, 45, 46, 48; 357/17

[56] References Cited

U.S. PATENT DOCUMENTS 4,360,919  11/1982  Fujiwara et al. ...................... 372/48
4,426,701  1/1984  Botez .................................... 372/48

Primary Examiner—James W. Davie
Attorney, Agent, or Firm—Noel F. Heal

[57] ABSTRACT

A semiconductor laser diode structure operable at high power and brightness levels and having a relatively low threshold current, high efficiency, good mode stability, and reduced temperature sensitivity. The disclosed embodiments have twin parallel channels formed in a p type substrate, and employ an n type blocking layer to confine current to a region between and including the channels. The structure includes first and second inactive cladding layers, and an active layer forming a diode junction. The first or lower inactive layer is thinner in the region between the channels, and this results in a higher forward-bias voltage at the center of the active layer, thereby focusing the current near the central position. This current focusing mechanism, which is enhanced by the optional use of a curved active layer, results in the improved characteristics of the structure. By selecting the effective width of a contact stripe overlying the second or upper inactive layer, single or multiple optical gain filaments may be produced.

47 Claims, 12 Drawing Figures

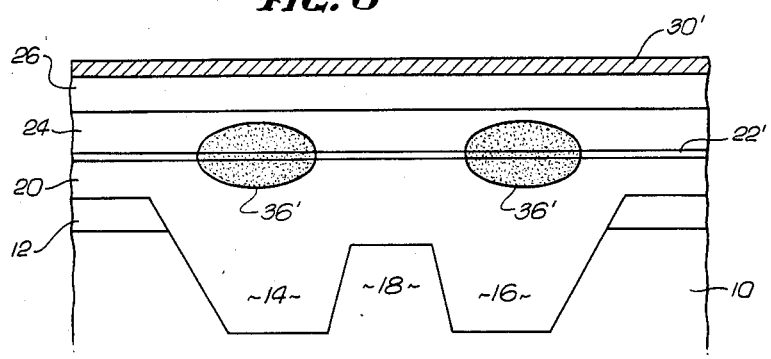
Fig. 6
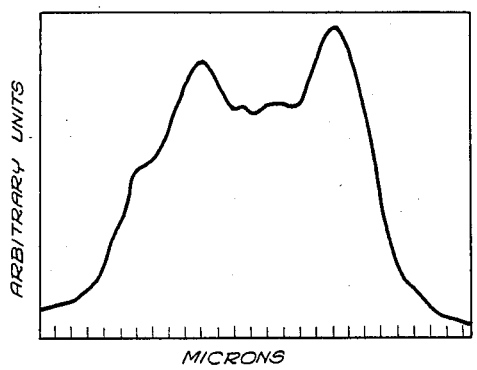
Fig. 7
Fig. 9a
Fig. 9b
Fig. 9c
Fig. 9d
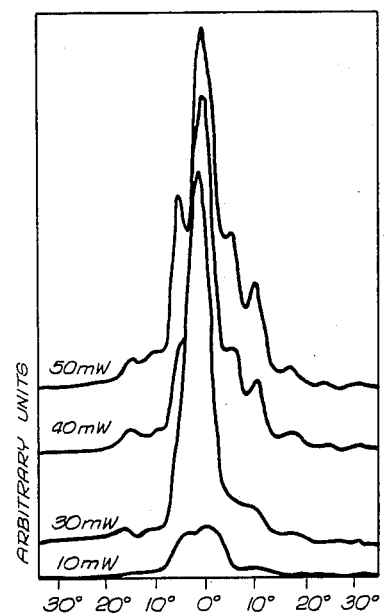
Fig. 8

SEMICONDUCTOR LASER WITH BLOCKING LAYER

CROSS-REFERENCE TO RELATED APPLICATION

This application is related to Ser. No. 556,879, filed in the names of Luis Figueroa, et al. on Dec. 1, 1983, entitled "Semiconductor Laser Structure."

BACKGROUND OF THE INVENTION

This invention relates generally to semiconductor lasers, and more particularly, to laser structures for achieving high power outputs, as by incorporating multiple lasing elements into a single device.

By way of background, the basic structure of a p-n junction laser includes an active layer of semiconductor material sandwiched between an n type material and a p type material. A pair of parallel faces of the structure, perpendicular to the plane of the active layer, are cleaved or polished, and the remaining faces are roughened to eliminate lasing in directions other than the desired one. The entire structure is called a Fabry-Perot cavity. When a forward bias voltage is applied across the junction, a current flows. Initially, at low currents, there is spontaneous emission of light from the cavity, in all directions. As the bias is increased, eventually a threshold current is reached at which stimulated emission occurs and a monochromatic and highly directional beam of light is emitted from the junction.

Although many different semiconductor laser geometries have been constructed or proposed, lasers of the double heterostructure type are probably the most widely used. In a double heterostructure (DH) laser, the active layer is sandwiched between two inactive layers that take the form of crystalline solid solutions, such as aluminum gallium arsenide ($Al_xGa_{1-x}As$), where x is the fraction of aluminum arsenide in the material. The DH laser has the advantage of being less temperature dependent and operating at a lower current density than a homostructure laser. Also the DH laser provides a greater difference in refractive index at the boundaries between the active and inactive layers, and therefore confines the light more effectively within the active layer.

Unfortunately, merely increasing the width of a lasing cavity may not result in increased brightness. A wide cavity tends to operate in multiple spatial modes, and the laser light source will then include multiple spots or filaments. This will increase the divergence angle of the resulting beam from the device. For this reason, the brightness, which is the power per unit source area per unit solid angle of the beam, may not be increased at all. Accordingly, there is a need for a more effective technique for providing high power and brightness levels from lasers of this type.

It has been recognized that the use of a curved active layer junction in a semiconductor laser has a desirable current focusing effect at the center of the device. This is discussed generally in a paper by L. Figueroa and S. Wang entitled "Curved junction stablized filament (CJSF) double-heterostructure injection laser," Appl. Phys. Lett. 32, pp. 55-57.

In addition, it has been recognized that mode stabilization of lasers may be achieved by use of a p type substrate and an n type blocking layer for current confinement. See T. Hayakawa et al., "Highly reliable and mode-stabilized (GaAl)As double-heterostructure visible lasers on p-GaAs substrate," Proc. 1981 Intl. Electron Device Meeting, pp. 443-46 (1981).

Various other publications have suggested semiconductor laser structures with curved junctions For example:

R. D. Burnham et al., "Nonplanar large optical cavity GaAs/GaAlAs semiconductor laser," Appl. Phys. Lett. 35, pp. 734-36 (1979);

D. Botez, "CW high-power single-mode operation of constricted double-heterostructure AlGaAs lasers with a large optical cavity, "Appl. Phys. Lett. 36, pp. 190-92 (1980);

D. Botez, "Constricted double-heterostructure AlGaAs diode lasers: structures and electro-optical characteristics," IEEE J. Quantum Electron. QE-17, No. 12, pp. 2290-2309 (1981); and U.S. Pat. No. 4,215,319 to D. Botez, entitled "Single Filament Laser."

In view of the prior art that has been discussed, there is still a need for further improvement in efficiency, threshold current, and temperature stability of high-power lasers of this general type. The present invention is directed to this end.

SUMMARY OF THE INVENTION

The present invention resides in a semiconductor laser structure having multiple channels in a substrate, and a blocking layer of opposite polarity type to the substrate, to confine the current flow through the device. Briefly, and in general terms, the structure of the invention in its broadest sense includes a substrate having at least two parallel channels formed in one of its surfaces, a first inactive cladding semiconductor layer of the same polarity type material as the substrate, a second inactive cladding semiconductor layer of opposite polarity type material, an active semiconductor layer disposed between the first and second inactive layers, and a blocking layer of opposite polarity type material to the substrate, disposed between the substrate and the first inactive layer, except in a region defining at least two laser channels. The device also includes means for applying a bias voltage across the inactive layers, to produce optical gain in the device. The blocking layer and the first inactive layer form a semiconductor junction that is reverse-biased during operation of the device, thereby effectively inhibiting current in any area outside the laser channels.

Preferably, the substrate is of p type material and the blocking layer of n type material. Since the first inactive layer is then also of p type material, which has a lower current conductivity than n type material, there is less lateral current flow through the first inactive layer than in devices based on an n type substrate. In other words, the current distribution tends to remain focused at the center of the device.

In a presently preferred embodiment of the invention, the laser channels are separated by an intermediate pedestal or mesa formed as part of the substrate. Since the thickness of the first inactive layer above the pedestal is smaller than the thickness of the same layer directly over the channels, the forward bias voltage across the junction is greatest at center of the region overlying the laser channels, and the current flow is effectively focused at this central position. This focusing mechanism is further enhanced at high currents, and the resulting device has a lower threshold current and a higher efficiency than other similar devices, including the device disclosed in the cross-referenced application.

In one disclosed embodiment of the invention, the active layer is curved convexly toward the substrate. This enhances the current focusing mechanism of the device, since the curvature in current path lengths that are shortened toward the center of the device.

The means for applying a bias voltage across the inactive layers includes a contact stripe disposed over the channel regions of the device. In one embodiment of the invention, the contact stripe is wide in relation to the width of the channels, and the device tends to produce optical gain in two principal regions above the channels. In the intermediate region between the channels there may also be optical gain, or at least a sufficiently reduced loss that the two principal lasing regions are closely coupled together in an in-phase relationship. In another embodiment, the contact stripe is relatively narrow, and the region of optical gain is confined to a single region centered between the channels.

In another preferred embodiment of the invention, the active layer is substantially planar. For reasons not completely understood, the planar version provides closer coupling between the lasing regions and improved mode stability at higher power levels.

In accordance with another aspect of the invention, the height of the mesa separating the two channels in less than that of the substrate ledges on the opposite sides of the channels. The height of this mesa is chosen to provide sufficient thickness in the first inactive layer to provide low enough absorption losses in the intermediate region between the channels, to result in close coupling between the principal lasing regions over the channels. In the presently preferred embodiment of the invention, the desired reduction in mesa height is obtained during a fabrication step in which the first inactive layer is formed. A liquid-phase epitaxy (LPE) process is used, and provides a "melt-back" of the mesa before the inactive layer is built up. The mesa, being of smaller width than the substrate ledges on the opposite sides of the channels is melted back more than these ledges. The result is a mesa of decreased height, which is effective in reducing absorption losses in the intermediate lasing region. The somewhat higher substrate ledges on the other sides of the channels serve to contain the lasing within the principal lasing regions.

In the presently preferred form of the invention, the width of the channels and the width of the intermediate region between channels are selected to be approximately one to two diffusion lengths, so as to support only a single lasing filament. For a gallium aluminum arsenide laser, this width dimension is approximately in the range of 1-8 microns. For wider lasing regions, multi-filament lasing will occur, and the degree of coupling between channels will be lessened, although some advantage may still be obtained from the structure of the invention.

Another aspect of the invention involves the use of multiple coupled lasing regions to provide a selected longitudinal mode of operation. One principal lasing region is defined to provide a different set of longitudinal modes from the other. Because the two regions are closely coupled, the composite of the lasing regions operates only in those modes that are common to both regions. By appropriate design of the principal lasing regions, the structure may be made to operate in a single desired longitudinal mode, which is stable even when the device is subject to modulation. The lasing regions may be designed to produce different longitudinal modes by varying the thickness of the active layer. This changes the effective refractive index of the layer and results in different longitudinal modes of operation. Alternatively, the lasing regions can be defined by channels of different dimensions.

It will be appreciated from the foregoing that the present invention represents a significant advance in the field of semiconductor diode lasers. In particular, the invention provides a high-power, high-brightness laser that is more efficient and has a lower threshold current than its predecessors. Although curvature of the active layer enhances the current focusing ability of the device, the curvature is not a necessary feature of the geometry, since the current focusing mechanism is also contributed to by the geometry of the multiple channels. For this reason there is considerable flexibility in production tolerances needed to control the curvature of the active layer. Other aspects and advantages of the invention will become apparent from the following more detailed description, taken in conjunction with the accompanying drawings.

BRIEF DESCRIPTION OF THE DRAWINGS

FIG. 6 is a simplified cross-sectional view of another preferred embodiment of the invention, having a planar active layer;

FIG. 7 is a graph showing the near-field radiation distribution characteristic of the structure of FIG. 6;

FIG. 8 is a graph showing the far-field radiation distribution characteristic of the same structure; and FIGS. 9a-9d are diagrammatical representations showing, respectively, multiple longitudinal modes of a first laser cavity, multiple longitudinal modes of a different laser cavity, the gain-versus-wavelength profile of a laser structure, and a single longitudinal mode output from the structure.

DESCRIPTION OF THE PREFERRED EMBODIMENTS

Figure 1:
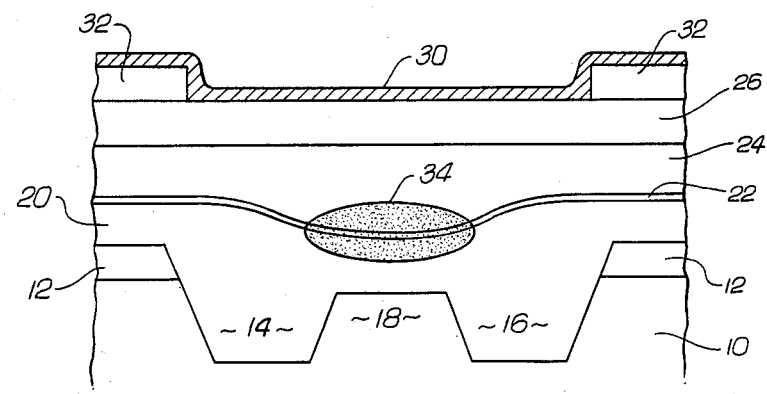
FIG. 1 is a simplified cross-sectional view of a semiconductor laser structure in accordance with the invention.

As shown in the drawings for purposes of illustration, the present invention is concerned with improvements in semiconductor lasers. Prior semiconductor laser structures have not been able to provide high power and brightness levels in a completely satisfactory manner. The device described in the cross-referenced application probably comes closest to achieving ideal characteristics, but requires a deep zinc diffusion process step to confine current flow in the device. Moreover, the threshold current and efficiency of the device are still not ideal.

The laser structure disclosed in the cross-referenced application represents a significant solution to the problem of obtaining high power and brightness levels from semiconductor lasers. The structure includes at least two principal lasing regions and an intermediate region in which optical gain is produced, to optically couple the two principal lasing regions. The device produces a desirable single-lobe far-field radiation distribution pattern, and is operable at high power and brightness levels.

One disadvantage of the structure disclosed in the cross-reference application is that it includes a zinc diffusion region in its top layer, to confine the current distribution as narrowly as possible to the lasing regions. The zinc diffusion region sometimes poses fabrication difficulties, and a different technique for control of current distribution would be desirable.

In accordance with the present invention, a multiple-channel semiconductor device is fabricated on a substrate, preferably of p type material, and a preferably n type blocking layer is disposed between the substrate and the first inactive layer, to confine the current flow to the channel regions. The use of a blocking layer in conjunction with the multiple-channel structure provides a current focusing capability not found in other devices, resulting in a lower threshold current, higher efficiency and reduced temperature sensitivity.

As shown by way of example in FIG. 1, the device of the invention includes a p type substrate, indicated by reference numeral 10, of gallium arsenide (GaAs). The first processing step is growing by liquid phase epitaxy (LPE) an n type layer of gallium arsenide 12, which will serve as the blocking layer. Then the substrate 10 and the blocking layer 12 are etched to define two parallel channels 14 and 16, shown in cross section in FIG. 1. The channels 14 and 16 extend the full length of the device, which is the direction perpendicular to the plane through which the cross-sectional view of FIG. 1 is taken. As shown in the drawings, the blocking layer 12 is completely etched away from the channel regions. A suitable etchant for this step is a solution of sulfuric acid, hydrogen peroxide and water ($H_2SO_4:H_2O_2:H_2O$). The channel depth in the illustrative embodiment is approximately 1.5 microns ($1.5 \times 10^{-6}$ meter), the channel width is approximately 2-5 microns, and the center-to-center channel spacing is approximately 4-10 microns.

Following the formation of the channels 14 and 16, four additional layers are grown by liquid-phase epitaxy to form a semiconductor laser of double-heterostructure (DH) configuration. During the first part of this LPE process, a "meltback" of an intermediate region or mesa 18 between the channels is obtained, concurrently eliminating the blocking layer from the mesa. The layers include a first inactive cladding layer 20 of p type gallium aluminum arsenide ($Ga_{0.65}Al_{0.35}As$), an active layer 22 of undoped gallium aluminum arsenide ($Ga_{0.94}Al_{0.06}As$), a second inactive cladding layer 24 of n type gallium aluminum arsenide ($Ga_{0.65}Al_{0.35}As$), and a top layer 26 of n type galium arsenide (GaAs). It will be understood that these compositions are merely exemplary. The desired optical properties of the cladding layers could be obtained by use of a variety of materials in the active and inactive layers.

One of the dimensions that has to be selected and controlled with care to ensure proper operation of the structure in accordance with the invention, is the depth of the first inactive layer 20 in the intermediate region above the mesa 18 formed between the two channesl 14 and 16. In structures of the prior art, the depth of the first inactive layer between lasing regions is made relatively thin to maximize absorption losses in the intermediate region, thereby ensuring isolation of the lasing regions. Because of the relative crystal bandgap energies of the active layer and the substrate materials, there is a tendency for light generated in the active layer near the intermediate region to be absorbed in the substrate material, if the first cladding inactive layer is thin enough.

The amount of the absorption loss in the intermediate region between the channels depends on the depth of the first inactive layer 20 and the depth of the active layer 22. The theoretical absorption losses for various layer dimensions have been documented in the technical literature. For example, K. Aiki et al. in "Transverse Mode Stabiized $Al_xGa_{1-x}As$ Injection Lasers with Channeled-Substrate-Planar Structure," IEEE J. Quant. Elect., Vol. QE-14, No. 2, p. 89 (1978), provide a graph in their FIG. 2(b) showing the relationship between absorption loss, the thickness of active layer and the thickness of first inactive layer.

With a knowledge of the threshold optical gain that a laser cavity can provide, one can determine from such a graph what the minimum thickness of the first inactive layer 20 should be in order to achieve sufficiently reduced absorption losses in the intermediate lasing region. The threshold gain is, of course, easily determinable from the length of the cavity, the reflectivity of its facets, and other parameters of the semiconductor material. For example, the threshold gain for gallium arsenide lasers is typically in the range of 50-100 $cm^{-1}$. From the absorption loss curves discussed above, one can determine the thickness of the first inactive layer that will result in the same loss as the threshold gain. For gallium arsenide and an active layer thickness of 400-1,000 angstroms, the minimum thickness of the first inactive layer is approximately 0.6 micron. The structure of the invention is preferably configured to provide at least this thickness in the intermediate region, to ensure a positive net optical gain in the intermediate region. For other materials and configurations, similar calculations may be made to determine the minimum thickness of the first inactive layer.

Although the precise nature of the activity in the intermediate region 18 is not understood, it is presently believed that it is not necessary to have a net optical gain in the intermediate region. Instead, there should be a region of reduced absorption losses, to provide coupling between the principal lasing regions.

In the presently preferred fabrication process, the desired thickness of the first inactive layer 22 is obtained by means of the liquid-phase epitaxy (LPE) step used to form the layer 22. The LPE step provides a "melt-back" of the mesa 18 before the inactive layer 22 is built up. Since the mesa 18 is narrower than the ledges on opposite sides of the channels, it is melted back more than the ledges, resulting in a mesa of decreased height, and reduced absorption losses in the intermediate region.

Figure 2:
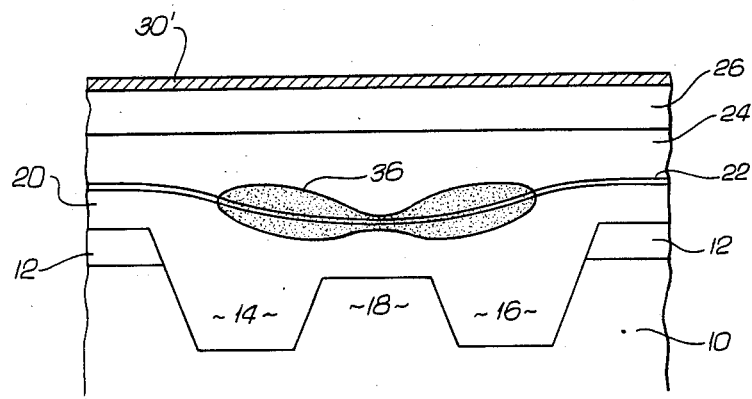
FIG. 2 is a cross-sectional view similar to FIG. 1, but including a wider contact stripe to produce optical gain in multiple filaments.

In the embodiments illustrated in FIGS. 1 and 2, the active layer 22 is curved convexly toward the substrate 10 in the region immediately above the intermediate region 18 between the two channels 14 and 16. As will be discussed, this curved-junction geometry serves to enhance the current focusing mechanism of the device, but is not critically necessary to achieving current focusing. Curved semiconductor structures are known to be difficult to reproduce reliably and acurately. However, since the junction curvature in this device is helpful but not absolutely necessary, fabrication of the curvature to fine tolerances is not a requirement. Accordingly, desirably high production yields can be obtained.

A metalization layer 30 is formed over the top layer 26 by conventional fabrication techniques. In the embodiment shown in FIG. 1, the effective width of the metalization layer 30 is approximately the same as the width of the two channels 14 and 16 taken together. Outside of this twin-channel region, there is an insulating layer 32 of silicon nitride ($Si_3N_4$) interposed between the top layer 16 and the metalization layer 30. The narrow effective width of the metallization layer or contact stripe 30 functions to confine the current in such a manner that only a single region of optical gain is formed, as indicated by the shaded area 34 above the intermediate region 20 between the channels 14 and 16.

In the embodiment shown in FIG. 2, there is no silicon nitride layer, and the metalization layer, indicated at 30', extends across the entire width of the top layer 26. In this case, multiple phase-locked optical gain regions are formed, as indicated by the shaded area 36. The near-field pattern of this form of the device basically includes two lobes derived from gain regions formed above the channels 14 and 16, and a center lobe derived from the optical gain above the intermediate region 18. Use of this broad-area contact stripe 30' not only provides multiple phase-locked lasing filaments, but eliminates a processing step by eliminating the insulating layer 32.

A third embodiment of the invention is shown in FIG. 6. Basically, it is the same as the FIG. 2 embodiment, except that a planar active layer 22' is employed. For reasons that are still not completely understood, this embodiment of the invention provides even better performance characteristics than the FIG. 2 version. In particular, the FIG. 6 device has improved coupling in the intermediate region 18, and better mode stability at high power levels. The optical gain regions, or lasing filaments, are shown schematically at 36'.

One explanation of the improved performance of the planar version has to do with unavoidable thickness variations in a curved active layer, caused by the nature of the LPE process. It has been observed that the thickness of the curved active layer is greatest at the central intermediate region 18. Although this would tend to increase coupling between the principal lasing regions, the gain of a laser varies inversely with the active layer thickness, so that the central region will have reduced gain and hence reduced coupling. It is theorized that this latter effect dominates, which explains the enhanced performance of the planar version of FIG. 6.

FIG. 7 shows the near-field pattern of the device illustrated in FIG. 6. The pattern shows a close coupling between the two principal lasing regions and an intermediate region that has reduced absorption losses, but does not have a positive optical gain. The far-field pattern, shown in FIG. 8 for various power levels up to 50 mW, is basically single-lobed, indicating close, in-phase coupling between the lasing regions. These power levels are only exemplary, and the device has been tested to at least as high as 75 mW.

A critical feature of the invention is the current focusing mechanism resulting from the inclusion of the p type substrate 10 and the blocking layer 12 in combination with the multi-channel structure. The blocking layer 12 functions to practically eliminate current flow through it, since the junction between the blocking layer and the first inactive layer 20 is a reverse-biased n-p junction. Consequently, current from the substrate 10 is forced to flow directly into the first inactive layer 20, through the region including the two channels 14 and 16 and the intermediate region 20.

More specifically, the current focusing mechanism arises because of positionally dependent variations in the voltage drop across the active layer 22. If one considers a current path vertically through the axis of symmetry of the device, the path length through the first inactive layer 20 is considerably shorter than that of a current path displaced to either side of the center. The central path is shorter for two reasons: the convex or downwardly curving active layer 22, and the upwardly extending intermediate region 18 forming a pedestal in the substrate 10. Since the resistivity of the p type inactive layer is relatively high, the differences in path lengths give rise to significant differences in voltage drops along the paths. There will therefore be a smaller voltage drop along the shorter central path than along a path displaced to either side, and the voltage on the lower side of the active layer 22 will be higher in the center than away from the center. There are also path length differences in the second inactive layer 24, but since this layer has a lower resistivity, these differences do not give rise to such significant voltage differences on the upper side of the active layer 22.

The effect of these lateral voltage differences is that the junction formed by the active layer is forward-biased to a greater degree at the center of the device than elsewhere. Since the current through a p-n junction increases exponentially with voltage, this means that the current density through the junction will be greater at the center of the device. In other words, the geometry of the structure results in a current focusing mechanism that concentrates the current toward the center of the device.

In mathematical terms, the difference between the forward bias voltage at the center of the device and the forward bias voltage at some point displaced from the center, is given by the difference between two line integrals $v_p$ and $v_n$, where:

$$v_p = \int \vec{J_p} \cdot d\vec{S_p} / \sigma_p,$$

and $$v_n = \int \vec{J_n} \cdot d\vec{S_n} / \sigma_n.$$

In these expressions, J is the current density, $d\vec{S}$ is a displacement vector along the active layer 22, and $\sigma$ is the conductivity. The subscripts p and n denote values measured on the p type and n type sides of the junction, respectively. The line integral in each case is taken over limits extending from the center of the device to a desired point of interest displaced from the center. The integral $v_p$, therefore, represents the voltage difference between the center of the device and the displaced position, as measured along the p side of the active layer 22. The integral $v_n$ represents the voltage difference mesured laterally along the n side of the active layer 22. For practical purposes, the integral $v_n$ is close to zero, and the difference between the forward bias at the center and the forward bias at the laterally displaced location is approximately equal to $v_p$.

The current focusing mechanism is self-reinforcing. As more current begins to flow through the center of the device, the forward bias voltage at the central position is increased, and the current through the junction increases exponentially with the forward bias voltage. One important effect of current focusing at the central position is to enhance the fundamental mode stability of the device.

Another important effect of the current focusing mechanism is that the temperature sensitivity of the device is significantly decreased. The threshold current of a semiconductor laser increases with increasing temperature. Basically, the threshold current is a function of $T/T_0$, where T is the temperature and $T_0$ is a constant having same dimensional units as temperature. Typical values of $T_0$ for most lasers are about 160° K. In the device of the invention, $T_0$ is significantly increased, to values in the range of 190°–200° K., meaning that the threshold current will be less dependent on temperature.

Figure 4:
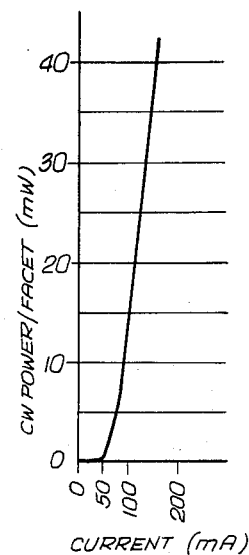
FIG. 4 is a graph showing the power-versus-current characteristic of the device of the invention.

One of the most important advantages of the novel structure of the invention is that the threshold current is dramatically reduced in comparison to similar devices of the same general type. As shown in FIG. 4, the threshold current of the device is only approximately 50 milliamperes (mA), compared with typical values in excess of 100 mA in other devices. Another related effect is that the efficiency of the device increases as the current and power are increased. This is contrary to the characteristic behavior of other devices, in which the efficiency decreases as the current and power are increased. The efficiency is defined as the output power per unit input current, i.e. the slope of the power-current curve in FIG. 4. It will be observed that the steepness of the curve increases slightly as the current and power increase.

Figure 3:
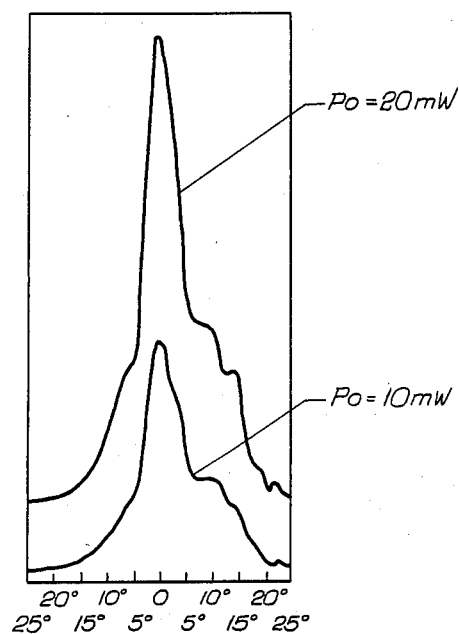
FIG. 3 is a graph showing the far-field radiation distribution characteristic of the device of the invention, at two power levels.
Figure 5:
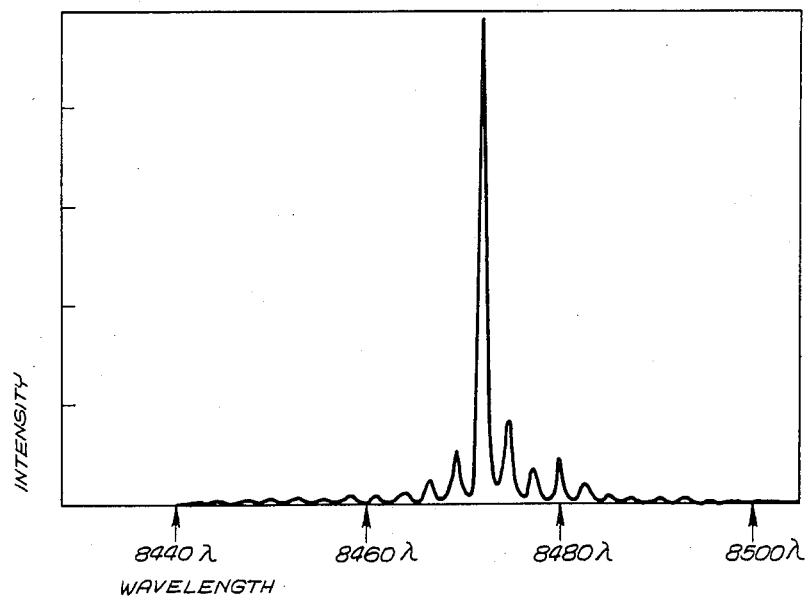
FIG. 5 is a graph showing the output spectrum of the device, plotting relative intensity versus wavelength.

FIG. 3 shows the far-field radiation characteristic for the device of the invention, for powers of 10 milliwatts (mW) and 20 mW. The characteristic has a predominant center lobe and only small side lobes. FIG. 5 shows the wavelength spectrum for the device. Basically, the device is monochromatic, with very small components at nearby wavelengths.

Although the dimensions and doping concentrations of the various layers in the device of the invention are not critical, the following values are provided by way of illustration. The substrate 10 has a concentration of $3 \times 10^{18}$ cm$^{-3}$ of a zinc impurity. The blocking layer 12 has a concentration of $1 \times 10^{18}$ cm$^{-3}$ of tellurium (Te) and a thickness of approximately 1.0 micron. The first inactive layer 20 has a concentration of $7-8 \times 10^{17}$ cm$^{-3}$ of zinc and a thickness of approximately 1.0 micron in the region outside of the channels 14 and 16 and the intermediate region 18. The active layer 22 is undoped and has a thickness of approximately 400–1000 angstroms. The second inactive layer 24 has a concentration of $7-8 \times 10^{17}$ cm$^{-3}$ of tellurium (Te) and a thickness of approximately 3.0 microns in the region outside of the channels 14 and 16 and the intermediate region 18. Finally, the top layer 26 has a concentration of $1-2 \times 10^{18}$ cm$^{-3}$ of tellurium (Te) and a thickness of approximately 1.0 micron.

Another important aspect of the invention relates to mode selectivity. In general, each principal lasing cavity is capable of producing a multiplicity of longitudinal modes separated by a wavelength displacement $\Delta\lambda$. $\Delta\lambda$ is given approximately by the expression:

$$\Delta\lambda = \frac{\lambda^2}{2N_{eff} \cdot L}$$

where
$\lambda$ = wavelength,
$N_{eff}$ = effective refractive index, and
L = length of cavity.

FIGS. 9a and 9b show diagrammatically the longitudinal modes associated with two laser cavities. The longitudinal modes in FIG. 9b are spaced closer together than those in FIG. 9a, either because of differences in length or because of differences in effective refractive index. In accordance with one aspect of the invention, the effective refractive index is varied by fabricating the two channels of the structure to have active layers of different thicknesses. As the thickness of the active layer is reduced, the effective refractive index tends to approach the theoretical refractive index of the surrounding inactive layers, which is lower than the theoretical refractive index of the active layer. Therefore, varying the thickness of the active layer affords some degree of control over the longitudinal mode spacing.

Since the two laser channels are closely coupled by the intermediate region between the channels, only the modes supported by both channels will be produced by the composite device. The close coupling, in effect, results in a logical AND of the two sets of longitudinal modes. Superimposed on this composite mode output characteristic is the gain-wavelength profile of the structure, as shown in FIG. 9c. This profile further filters the output of the device, which may therefore be selected to take the form of a single selected longitudinal mode, as indicated in FIG. 9d. So long as there is close coupling between the two principal lasing regions, the structure will function to provide stable longitudinal mode selection. Mode selection may be also effected by varying the dimensions of the channels 14 and 16, such that each channel produces different longitudinal modes.

Although the foregoing description has been in terms of a specific double heterostructure laser using gallium arsenide and gallium aluminum arsenide as materials, it will be understood that the principles of the invention are equally applicable to other semiconductor laser structures, using other materials. The number of semiconductor materials that exhibit laser action has continued to grow since a GaAs laser device was first demonstrated. At present, virtually all the lasing semiconductor materials have direct bandgaps. Various compound systems of materials from Groups III-V of the Periodic Table are good candidates for laser materials. These may be ternary compounds of the type $A_xB_{1-x}C$, or quaternary compounds of the type $A_xB_{1-x}C_yD_{1-y}$, where A and B are Group III elements and C and D are Group V elements. Two important Group III-V compound solutions are $Al_xGa_{1-x}As_ySb_{1-y}$ and $GA_xIn_{1-x}As_yP_{1-y}$. Group IV-VI compounds, such as PbS, PbTe, PbSe and related solid solutions, also exhibit laser action and may employ the invention to advantage. Just as the invention is not limited to any particular semiconductor materials, neither is it limited to any particular fabrication process. The LPE process used in fabrication of the illustrative embodiment of the invention has the advantage that it melts back the central substrate mesa to produce a desired optical gain in the intermediate region. However, the mesa may be reduced in height by other techniques, such as etching, and an entirely different fabrication process employed without departing from the invention in its broadest sense.

It will be appreciated from the foregoing that the present invention represents a significant advance in the field of semiconductor lasers. In particular, the invention provides a laser structure capable of operation at high power and brightness levels, in the range 40–150 mW from a single facet, while maintaining lateral as well as longitudinal mode stability. The device of the invention also has a low threshold current, a high efficiency, and reduced sensitivity to temperature changes. Most of these advantages result from the current focusing mechanism provided by the structure of the invention, specifically the multiple-channel configuration and, in part, the curved geometry of the active layer.

It will also be appreciated that, although specific embodiments of the invention have been described in detail for purposes of illustration, various modifications may be made without departing from the spirit and scope of the invention. Accordingly, the invention is not to be limited except as by the appended claims.

We claim:

1. In a semiconductor laser diode operable at high power and brightness levels, a structure comprising:
    a semiconductor substrate having at least two parallel channels formed in one of its surfaces;
    a first inactive cladding semiconductor layer of the same polarity type material as the substrate, overlying the substrate;
    a second inactive cladding semiconductor layer of the opposite polarity type material;
    an active semiconductor layer disposed between the first and second inactive layers;
    a blocking layer of opposite polarity type material to the substrate, disposed between the substrate and the first inactive layer, but only in regions outside of the substrate channels, and not in regions overlying or between the channels; and
    means for applying a bias voltage between the inactive layers, to produce optical gain in the device, wherein said means for applying a bias voltage includes a metallization layer extending over the substrate channels;
    whereby the blocking layer and the multiple channel structure together provide a current focusing mechanism that concentrates current flow through and between the channels, and thereby improves performance characteristics.

2. A semiconductor laser diode structure as set forth in claim 1, wherein:
    the means for applying a bias voltage includes a contact stripe formed in an overlying relationship with the second inactive layer.

3. A semiconductor laser diode structure as set forth in claim 2, wherein:
    the contact stripe is relatively wide in relation to the combined widths of the channels, to provide a multi-filament optical gain area.

4. A semiconductor laser diode structure as set forth in claim 2, wherein:
    the contact stripe is relatively narrow and extends only over the channel widths, to provide a single-filament optical gain region centered over the combined channels.

5. A semiconductor laser diode structure as set forth in claim 1, wherein:
    the active layer is curved convexly toward the substrate, to enhance the current focusing mechanism of the structure.

6. A semiconductor laser diode structure as set forth in claim 1, wherein:
    the active layer is a substantially planar layer.

7. A semiconductor laser diode structure as set forth in claim 1, wherein:
    the channels define an intermediate mesa region in the substrate; and
    the thickness of the first inactive layer between the substrate mesa and the active layer is large enough to reduce absorption losses in the intermediate region to such a degree that there is close coupling between lasing regions above the channels.

8. A semiconductor laser diode structure as set forth in claim 1, wherein:
    the thickness of the first inactive layer is greater in the region between channels than it is in areas outside the channels, to provide for close coupling in the region between channels, and yet to contain lasing within the channel regions.

9. In a semiconductor laser diode operable at high power and brightness levels, a structure comprising:
    a p type substrate having at least two parallel channels formed in one of its surfaces;
    a first inactive cladding semiconductor layer of p type material, overlying the substrate;
    a second inactive cladding semiconductor layer of n type material;
    an active semiconductor layer disposed between the first and second inactive layers;
    a blocking layer of n type material disposed between the substrate and the first inactive layer, but only in regions outside of the substrate channels, and not in regions overlying or between the channels; and
    means for applying a bias voltage between the inactive layers, to produce optical gain in the device, wherein said means for applying a bias voltage includes a metallization layer extending over the two substrate channels;
    whereby the blocking layer and the multiple channel structure together provide a current focusing mechanism that concentrates current flow through and between the channels, and thereby improves performance characteristics.

10. A semiconductor laser diode structure as set forth in claim 9, wherein:
    the means for applying a bias voltage includes a contact stripe formed in an overlying relationship with the second inactive layer.

11. A semiconductor laser diode structure as set forth in claim 10, wherein:
    the contact stripe is relatively wide in relation to the combined widths of the channels, to provide a multi-filament optical gain area.

12. A semiconductor laser diode structure as set forth in claim 10, wherein:
    the contact stripe is relatively narrow and extends only over the channel widths, to provide a single-filament optical gain region centered over the combined channels.

13. A semiconductor laser diode structure as set forth in claim 9, wherein:
    the active layer is curved convexly toward the substrate, to enhance the current focusing mechanism of the structure.

14. A semiconductor laser diode structure as set forth in claim 9, wherein:
    the active layer is a substantially planar layer.

15. A semiconductor laser diode structure as set forth in claim 13, wherein:
the means for applying a bias voltage includes a contact stripe formed in an overlying relationship with the second inactive layer.

16. A semiconductor laser diode structure as set forth in claim 15, wherein:
the contact stripe is relatively wide in relation to the combined widths of the channels, to provide a multi-filament optical gain area.

17. A semiconductor laser diode structure as set forth in claim 15, wherein:
the contact stripe is relatively narrow and extends only over the channel widths, to provide a single-filament optical gain region centered over the combined channels.

18. A semiconductor laser diode structure as set forth in claim 14, wherein:
the means for applying a bias voltage includes a contact stripe formed in an overlying relationship with the second inactive layer.

19. A semiconductor laser diode structure as set forth in claim 18, wherein:
the contact stripe is relatively wide in relation to the combined widths of the channels, to provide a multi-filament optical gain area.

20. A semiconductor laser diode structure as set forth in claim 18, wherein:
the contact stripe is relatively narrow and extends only over the channel widths, to provide a single-filament optical gain region centered over the combined channels.

21. A semiconductor laser diode structure as set forth in claim 9, wherein:
the number of channels is two.

22. A semiconductor laser diode structure as set forth in claim 10, wherein:
the number of channels is two.

23. A semiconductor laser diode structure as set forth in claim 12, wherein:
the number of channels is two.

24. A semiconductor laser diode structure as set forth in claim 13, wherein:
the number of channels is two.

25. A semiconductor laser diode structure as set forth in claim 14, wherein:
the number of channels is two.

26. A semiconductor laser diode structure as set forth in claim 15, wherein:
the number of channels is two.

27. A semiconductor laser diode structure as set forth in claim 16, wherein:
the number of channels is two.

28. A semiconductor laser diode structure as set forth in claim 17, wherein:
the number of channels is two.

29. A semiconductor laser diode structure as set forth in claim 18, wherein:
wherein the number of channels is two.

30. A semiconductor laser diode structure as set forth in claim 19, wherein:
wherein the number of channels is two.

31. A semiconductor laser diode structure as set forth in claim 20, wherein:
wherein the number of channels is two.

32. A semiconductor laser diode structure as set forth in claim 9, wherein:
the channels define an intermediate mesa region in the substrate; and
the thickness of the first inactive layer between the substrate mesa and the active layer is large enough to reduce absorption losses in the intermediate region to such a degree that there is close coupling between lasing regions above the channels.

33. A semiconductor laser diode structure as set forth in claim 9, wherein:
the thickness of the first inactive layer is greater in the region between channels than it is in areas outside the channels, to provide for close coupling in the region between channels, and yet to contain lasing within the channel regions.

34. A semiconductor laser diode structure as set forth in claim 33, wherein:
the first inactive layer is formed by liquid-phase epitaxy, and the substrate region between channels is melted back to a lower height during the liquid-phase epitaxy process, thereby producing the desired increased thickness of the first inactive layer in the intermediate region between channels.

35. A semiconductor laser diode structure as set forth in claim 8, wherein:
the thickness of the first inactive layer is greater in the region between channels than it is in areas outside the channels, to provide for close coupling in the region between channels, and yet to contain lasing within the channel regions.

36. A semiconductor laser diode structure as set forth in claim 35, wherein:
the first inactive layer is formed by liquid-phase epitaxy, and the substrate region between channels is melted back to a lower height during the liquid-phase epitaxy process, thereby producing the desired increased thickness of the first inactive layer in the intermediate region between channels.

37. In a semiconductor laser diode operable at high power and brightness levels, a structure comprising:
a p type substrate of gallium arsenide (GaAs) having two parallel channels formed in one of its surfaces;
a first inactive cladding semiconductor layer of p type gallium aluminum arsenide of approximately the composition $Ga_{0.65}Al_{0.35}As$, overlying the substrate;
a second inactive cladding semiconductor layer of n type gallium aluminum arsenide of approximately the composition $Ga_{0.65}Al_{0.35}As$;
an active semiconductor layer of gallium aluminum arsenide of approximately the composition $Ga_{0.94}Al_{0.06}As$ disposed between the first and second inactive layers;
a blocking layer of n type gallium arsenide disposed between the substrate and the first inactive layer, but only in regions outside of the substrate channels, and not in regions overlying or between the channels; and
means for applying a bias voltage between the inactive layers, to produce optical gain in the device, wherein said means for applying a bias voltage includes a metallization layer extending over the substrate channels;
whereby the blocking layer and the multiple channel structure together provide a current focusing mechanism that concentrates current flow through the two channels and toward an axis of symmetry between the two channels, and thereby improves performance characteristics.

38. A semiconductor laser diode structure as set forth in claim 37, wherein:
the means for applying a bias voltage includes a contact stripe formed in an overlying relationship with the second inactive layer.

39. A semiconductor laser diode structure as set forth in claim 38, wherein:
the contact stripe is relatively wide in relation to the combined widths of the channels, to provide a multi-filament optical gain area.

40. A semiconductor laser diode structure as set forth in claim 38, wherein:
the contact stripe is relatively narrow and extends only over the channel widths, to provide a single-filament optical gain region centered over the combined channels.

41. A semiconductor laser diode structure as set forth in claim 37, wherein:
the active layer is curved convexly toward the substrate, to enhance the current focusing mechanism of the structure.

42. A semiconductor laser diode structure as set forth in claim 37, wherein:
the active layer is substantially planar.

43. A semiconductor laser diode structure as set forth in claim 37, wherein:
the channels define an intermediate mesa region in the substrate; and
the thickness of the first inactive layer between the substrate mesa and the active layer is large enough to reduce absorption losses in the intermediate region to such a degree that there is close coupling between lasing regions above the channels.

44. In a semiconductor laser operable at high power and brightness levels, a structure comprising:
an active semiconductor layer;
means defining at least two principal lasing regions laterally spaced in the active layer, the two principal lasing regions being configured to produce different sets of longitudinal modes of output;
means for defining an intermediate coupling region between the principal lasing regions, to produce close coupling between the principal lasing regions, resulting in a composite output from the structure that includes longitudinal modes common to both principal lasing regions, whereby the structure can be easily designed to operate in a single desired longitudinal mode;
and wherein the means defining the principal lasing regions and an intermediate coupling region include
a semiconductor substrate having two parallel channels formed therein,
a first inactive semiconductor layer of selected polarity type formed over the substrate,
a second inactive semiconductor layer of opposite polarity type to the first formed over said active layer, which is itself formed over the first inactive layer,
a top semiconductor layer formed over the second inactive layer,
a blocking layer of opposite polarity type to the substrate, between the substrate and the first inactive layer, but only in regions outside of the substrate channels, and not in regions overlying or between the channels, and
means for applying a bias voltage across the structure, to produce optical gain, including a metallization layer formed over the top semiconductor layer and extending over both parallel channels.

45. A semiconductor laser structure as set forth in claim 44, wherein:
the means for defining at least two principal lasing regions includes means for varying the thickness of said active layer, to provide corresponding variations in the effective refractive index and the longitudinal mode spacing.

46. A semiconductor laser structure as set forth in claim 44, wherein:
the means for defining at least two principal lasing regions includes means for varying the channel dimensions to provide for longitudinal mode selection.

47. A semiconductor laser as set forth in claim 44, wherein:
the substrate is of p type gallium arsenide (GaAs);
the first and second inactive layers are of p type and n type, respectively, gallium aluminum arsenide of approximately the composition $Ga_{0.65}Al_{0.35}As$;
the active layer is of gallium aluminum arsenide of approximately the composition $Ga_{0.94}Al_{0.06}As$;
the top layer is of n type gallium arsenide; and
the blocking layer is of n type gallium arsenide.

* * * * *